US009722106B2

United States Patent
Jaffrennou et al.

(10) Patent No.: US 9,722,106 B2
(45) Date of Patent: Aug. 1, 2017

(54) METHOD OF MANUFACTURING A SOLAR CELL WITH LOCAL BACK CONTACTS

(71) Applicants: Total Marketing Services, Puteaux (FR); Katholieke Universiteit Leuven, K.U. Leuven R&D, Leuven (BE); IMEC, Leuven (BE)

(72) Inventors: Perine Jaffrennou, Brussels (BE); Johan Das, Nieuwrode (BE); Angel Uruena De Castro, Heverlee (BE)

(73) Assignees: IMEC, Leuven (BE); Total Marketing Services, Puteaux (FR)

( * ) Notice: Subject to any disclaimer, the term of this patent is extended or adjusted under 35 U.S.C. 154(b) by 243 days.

(21) Appl. No.: 14/349,111

(22) PCT Filed: Oct. 5, 2012

(86) PCT No.: PCT/EP2012/069764
§ 371 (c)(1),
(2) Date: Apr. 2, 2014

(87) PCT Pub. No.: WO2013/050556
PCT Pub. Date: Apr. 11, 2013

(65) Prior Publication Data
US 2014/0311563 A1 Oct. 23, 2014

(30) Foreign Application Priority Data
Oct. 7, 2011 (EP) .................................... 11290466

(51) Int. Cl.
*H01L 31/0224* (2006.01)
*H01L 31/0216* (2014.01)
(Continued)

(52) U.S. Cl.
CPC .... *H01L 31/022441* (2013.01); *B23K 26/362* (2013.01); *B23K 26/40* (2013.01);
(Continued)

(58) Field of Classification Search
None
See application file for complete search history.

(56) References Cited

U.S. PATENT DOCUMENTS

2006/0046461 A1*  3/2006  Benson .................. H01L 21/563
                                                              438/612
2008/0075840 A1   3/2008  Enjalbert et al.
(Continued)

OTHER PUBLICATIONS

Jaffrennou, et al.; "Laser Ablation of SiO2/SiNx and AlOx/SiNx Back Side .Passivation Slacks for Advanced Cell Architectures;" 28th European Photovoltaic Solar Energy Conference and Exhibition; Sep. 2011; pp. 2180-2183.*
(Continued)

*Primary Examiner* — Jennifer Michener
*Assistant Examiner* — Christopher Danicic
(74) *Attorney, Agent, or Firm* — Daly, Crowley, Mofford & Durkee, LLP

(57) ABSTRACT

The invention relates to the manufacturing process of a solar cell (1) with back contact and passivated emitter, comprising a dielectric stack (10) of at least two layers consisting of at least a first dielectric layer (11) made of AlOx in contact with a p-type silicon layer (3), and a second dielectric layer (13) deposited on the first dielectric layer (11). Besides, the method of manufacturing comprising a formation step of at least one partial opening (15) preferably by laser ablation into the dielectric stack (10), sparing at least partially the aforementioned first dielectric layer.

12 Claims, 2 Drawing Sheets

(51) Int. Cl.
H01L 31/061 (2012.01)
H01L 31/18 (2006.01)
B23K 26/362 (2014.01)
B23K 26/40 (2014.01)
B23K 103/16 (2006.01)

(52) U.S. Cl.
CPC ............ H01L 31/02168 (2013.01); H01L 31/022425 (2013.01); H01L 31/061 (2013.01); H01L 31/18 (2013.01); H01L 31/1804 (2013.01); B23K 2203/172 (2015.10); Y02E 10/547 (2013.01); Y02P 70/521 (2015.11)

(56) References Cited

U.S. PATENT DOCUMENTS

2011/0126898 A1* 6/2011 Harley ............... H01L 31/0682
136/256
2012/0024336 A1* 2/2012 Hwang ............ H01L 31/02167
136/244

OTHER PUBLICATIONS

Mangersnes, K, et al, "Damage free laser ablation of SiO2 for local contact opening on silicon solar cells using an a-Si:H buffer layer", Journal of Applied Physics, vol. 107, p. 043518, (2010).*

Schmidt, J., et al. "Silicon surface passivation by ultrathin Al2O3 films and Al2O3/SiNx stacks". In Photovoltaic Specialists Conference (PVSC), 2010 35th IEEE (pp. 000885-000890), (Jun. 2010).*
Bahr, et al.; "Ablation of Dielectrics Without Substrate Damage Using Ultra-Short-Pulse Laser Systems;" 2th European Photvoltaic Solar Energy Conferece and Exhibition / $5^{th}$ World Conference on Photovoltaic Energy Conversion; Sep. 6-10, 2010; pp. 2490-2496.
Heinrich, et al.; "Investigation of Ablation Mechanisms for Selective Laser Ablation of Silicon Nitride Layers;" ScienceDirect; Energy Procedia; vol. 8; Apr. 17-20, 2011; pp. 592-597.
Jaffrennou, et al.; "Laser Ablation of SiO2/SiNx and AlOx/SiNx Back Side Passivation Stacks for Advanced Cell Architectures;" $26^{th}$ European Photovoltaic Solar Energy Conference and Exhibition; Sep. 5. 2011; pp. 2180-2183.
Knorz, et al.; "Selective Laser Ablation of SiNx Layers on Textured Surfaces for Low Temperature Front Side Metallizations;" Progress in Photovoltaics Research and Applications; vol. 17; No. 2; Mar. 1, 2009; pp. 127-136.
Penaud, et al.; "Integration of Alox Passivation Layer in Perc-Based Solar Cells;" $26^{th}$ European Photovoltaic Solar Energy Conference and Exhibition; Sep. 5, 2011; pp. 2243-2246.
Zielke, et al.; "Contact passivation in silicon solar cells using atomic-layer-deposited aluminum oxide layers;" Phys. Status Solidi (RRL); vol. 5; No. 8; Aug. 1, 2011; pp. 298-300.
PCT European Search Report and Written Opinion of the ISA for PCT/EP2012/069764 dated Nov. 7, 2012.

* cited by examiner

METHOD OF MANUFACTURING A SOLAR CELL WITH LOCAL BACK CONTACTS

CROSS REFERENCE TO RELATED APPLICATIONS

This application is a National Stage application of PCT/EP2012/069764 filed in the English language on Oct. 5, 2012, and entitled "METHOD OF MANUFACTURING A SOLAR CELL WITH LOCAL BACK CONTACTS," which claims priority to European application EP11290466.9 filed on Oct. 7, 2011.

The invention relates to a method of manufacturing a solar cell with local back contacts.

The method of this invention can be applied for several manufacturing designs, such as PERC (passivated emitter and rear cell), PERL (passivated emitter and rear locally-diffused) or IBC (Interdigitated Back Contact) type solar cells.

For all of them, good passivation properties on the back face of the wafer surface are mandatory in order to reduce recombination losses.

In PERC technology, for example, the back face of the solar cells comprises a reflective coating made of a dielectric layer and a metal layer. The dielectric layer provides the aforementioned passivation. This dielectric layer is opened locally in order to allow the contact between the bulk silicon and the metal layer deposited right after.

In silicon solar cells, the most commonly used dielectric layer is hydrogenated silicon nitride (SiNx:H). This layer shows intrinsically net positive charges, which create a parasitic emitter layer for the case of p-type substrates, also called inversion layer, which, after the creation of a metallic contact, is responsible for an increase in recombination.

Thus, in p-type silicon PERC solar cells, the standard passivation stack for the back side is made of silicon oxide (SiO2) and SiNx:H, in order to decrease this effect.

Recently, works have been reported on the use of aluminium oxide (AlOx) layers for passivating the back side of p-type silicon solar cells. These AlOx layers have been shown to have intrinsic negative charges, which prevent the creation of a parasitic emitter on p-type silicon and facilitate the field-effect passivation.

In addition, a common way to fabricate the local openings into the dielectric layers is by means of laser ablation, which goes completely through the passivation stack.

However, it was shown that laser ablation of the SiO2 and SiNx passivation layers melts the underlying silicon surface, inducing damages. Various types of laser-induced damages can be created such as delamination or cracks in the dielectric layers around the openings, melting of the silicon, overheating of the dielectric layers around the openings. These damages induce a decrease in the passivation performance.

Moreover, it was shown that the damages caused in AlOx/SiNx passivation layers could modify the charges in the AlOx layer, thus inducing a decrease in field-effect passivation and leading to the creation of a parasitic emitter layer detrimental to solar cell performance.

In line with the common knowledge in the field of the art, laser ablation of SiO2 or AlOx has to be done completely in order to enhance the performances. This is due to the fact that in case of partial ablation in a SiOx/SiNx stack, the performance of a solar panel decreases because a partial ablation induces an increase of the series resistance of the solar cell.

A document representing such a prior art is "Laser ablation of SIO2/SINX and ALOX/SINX backside passivation stacks for advanced cell architectures." in: 26th European Photovoltaic Solar Energy Conference and Exhibition-EU-PVSEC. 2011. pp .2180-2183; (5-9 Sep. 2011; Hamburg, Germany).

This article teaches in particular in §4 that the optimal conditions are reached by a complete damage free laser ablation.

Complete laser ablation has been applied to $SiO_2$/SiNx and AlOx/SiNx layers. In case of AlOx/SiNx layers, the results showed lower performances as expected in view of the better passivation properties of AlOx as compared to $SiO_2$. Even a blistering effect has been observed.

The present invention aims at mitigating, at least partially, the drawbacks described above.

For this purpose, the invention proposes a method of manufacturing a solar cell with local back contacts comprising a dielectric stack of at least two layers presenting at least a first dielectric layer of AlOx in contact with a layer of p-type silicon and a second dielectric layer deposited on the first dielectric layer, characterized in that it comprises a step of formation of at least one partial opening in the dielectric stack, leaving at least partially the aforementioned first dielectric layer at the location of the partial opening.

Thanks to this process, the damages caused by the laser beam, such as the local heating and the delamination, occur only in the second dielectric layer, the first dielectric layer being at least partially preserved and the underlying bulk silicon is totally preserved.

In addition, although it was commonly admitted that laser ablation has to be complete in order not to increase series resistance of the solar cells, it was observed that the performances of the solar cells for partial laser ablation of AlOx even increased with respect to complete laser ablation.

In addition, the dielectric layers have passivation properties. A good passivation quality is thus maintained around the openings, which contributes to an improvement in short-circuit current and (Jsc), open circuit voltage (Voc), and in particular in the output compared to cells where the dielectric layer is completely ablated.

According to other characteristics taken alone or in combination:
- the step of formation of at least one partial opening in the dielectric stack comprises a laser ablation step,
- the ablation step is carried out using a pulse laser which pulse duration is less than a few nanoseconds,
- the first dielectric layer exhibits negative charges allowing field effect passivation,
- the first dielectric layer has a thickness of at least a few monolayers after ablation,
- the second dielectric layer is made of SiNx,
- the ablation step is carried out using a laser which radiates in the UV region, more specifically around 355 nm.

Other advantages and characteristics will appear with the reading of the description of the following figures, among which:

On all the figures the same references refer to the same elements.

Figure 1:
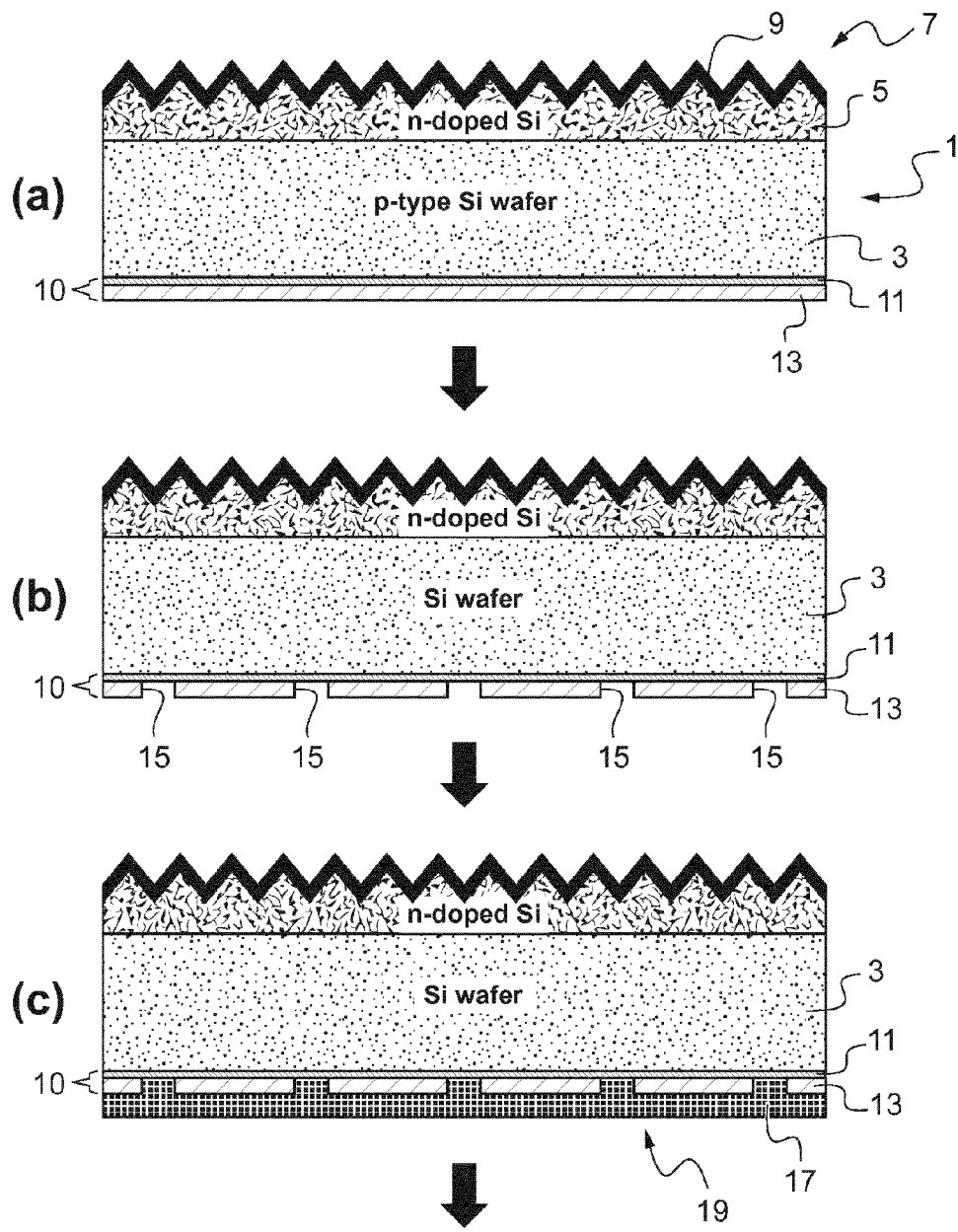
FIG. 1 shows diagrams of manufacturing of a PERC type solar cell.
Figure 1:
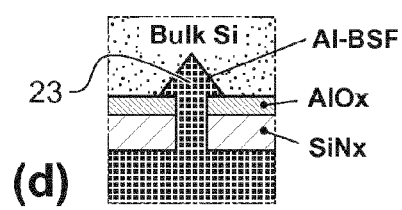

On FIG. 1, diagrams represent three steps (a), (b) and (c) of the manufacturing method of a solar cell with passivated back surface and local back contacts according to the invention.

FIG. 1 example, consists of a PERC type solar cell (passivated emitter and rear cell).

Of course, these three steps do not represent the whole cell manufacturing method, but only the steps concerning the invention. The other manufacturing steps are known by the field specialists, and do not require a description within the framework of this invention.

As can be seen on FIG. 1(a), at this step of manufacture, the photovoltaic cell 1 comprises a layer 3 substrate or p-type silicon wafer, a layer 5 of n-doped silicon on the front face 7.

On the front face 7 is also deposited an anti-reflecting layer 9 (ARC for "antireflection coating"), for example, silicon nitride SiNx.

On the back face of cell 1 is deposited a stack 10 of at least two dielectric layers 11 and 13.

In the present example, the first dielectric layer 11 is aluminum oxide AlOx.

The second dielectric layer 13 is for example silicon nitride SiNx, in particular hydrogenated silicon nitride SINx:H.

The first dielectric layer 11 is in contact with substrate 3 and the second dielectric layer 13 is deposited on the first dielectric layer 11.

Figure 2:
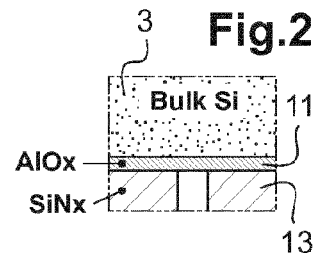
FIG. 2 shows a detail at the rear side after partial ablation of the dielectric stack.

According to step (b), one can proceed with a formation step of at least one local opening 15 by laser ablation in passivation stack 10, leaving at least partially the aforementioned first dielectric layer 11. This step can thus be qualified as partial laser ablation of the passivation stack 10, meaning that the SiNx layer is completely ablated whereas the AlOx layer is not or only partially ablated. One thus can obtain the configuration shown according to a detail on FIG. 2.

For this ablation process, optimal laser conditions (i.e. pulse duration, wavelength, power, etc) allowing a partial ablation as described above can be determined experimentally and are specific to the dielectric stack to be ablated. For example, one can use a single pulse laser of less than a few nanoseconds, also picoseconds or femptoseconds pulses and in the UV range, in particular at 355 nm wavelength.

After ablation, the first dielectric layer 11 preferably has a layer thickness thick enough (at least 1 nm) to exhibit negative charges and thin enough to allow a low temperature diffusion of Al metal through AlOx to form the contact, for example a thickness of at least a few monolayers after ablation, meaning a thickness between 1 nm and 30 nm after ablation.

Thus, the silicon of substrate 3 is not damaged by laser ablation.

Typically, one carries out the aforementioned partial openings by laser ablation with any pattern suitable for good optical reflection properties and with optimal metalized contacted area. For example, one can use a pattern composed of partial openings of about 40 μm separated by 600 μm.

Thanks to this process, the damages caused by the laser beam such as for example the local heating and the delamination occur only on the level of the second dielectric layer 13, the first dielectric layer 11 being preserved.

Then, on step (c), one proceeds to a step of a metallization layer 17 application on the rear face 19 of the photovoltaic cell. Any Al-based metallization method can be applied. This can for example be carried out by Al-sputtering on the rear face 19 of the solar cell 1.

Finally, on step (d), one performs on the areas where at least one partial opening 15 is spared, a backsurface field (BSF) formation by firing in a furnace at a temperature T>740° C., for example at 815° C.

Thanks to the method according to the invention, a good passivation quality around the metal contacts is maintained, which contributes to an improvement of the values of short circuit current (Jsc) by 1.6% and of open circuit voltage (Voc) by 1.1% compared experimentally with solar cells manufactured according to state of the art processes where the passivation stack is completely ablated. Similarly, the fill factor FF is improved by 0.35% and the efficiency itself by approximately 3%.

Figure 3:
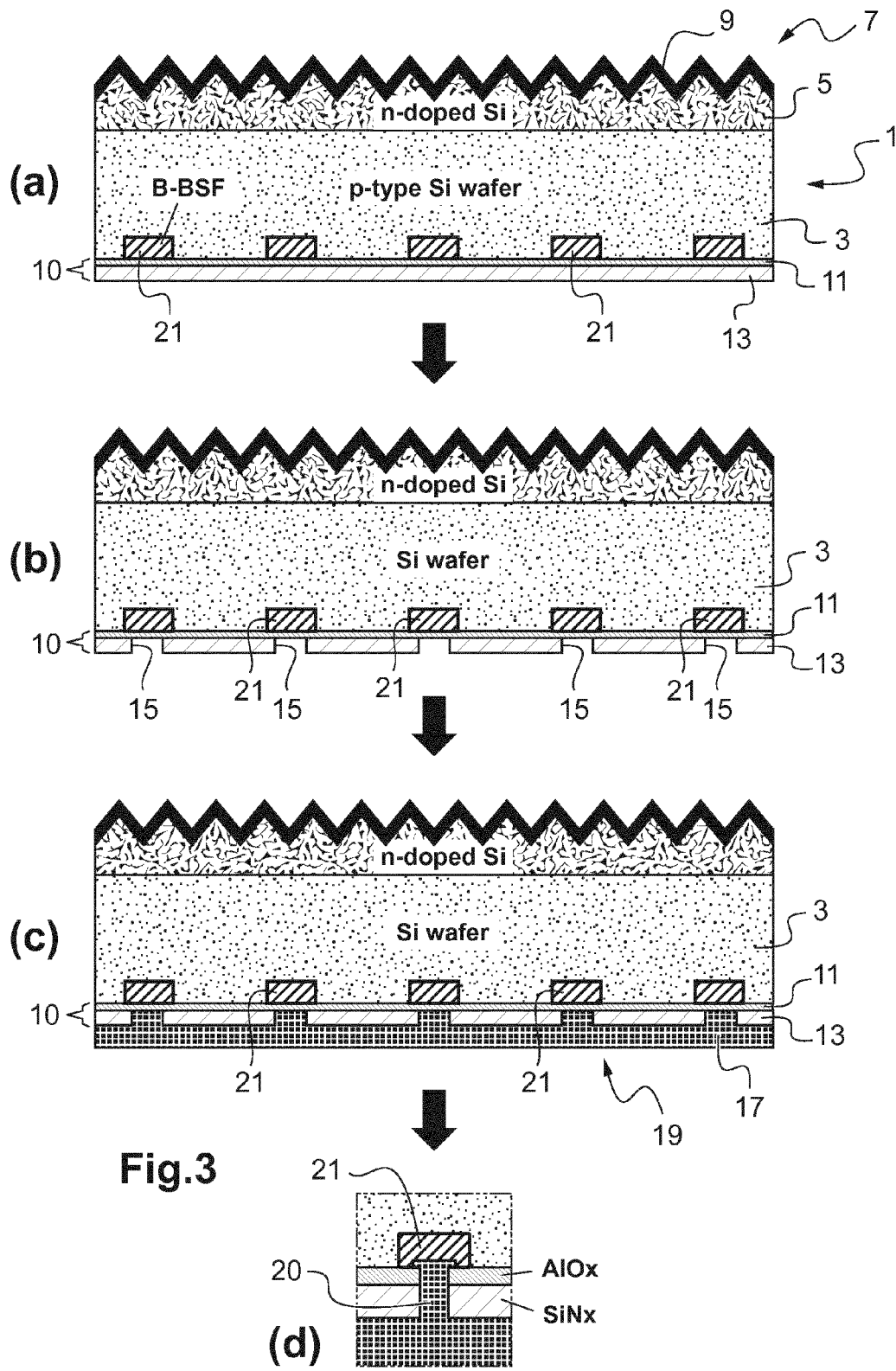
FIG. 3 shows diagrams of manufacturing of a PERL type solar cell.

FIG. 3 shows the manufacturing process of a solar cell similar to that on FIG. 1, but this time for a PERL type solar cell.

In this case and unlike PERC cells, in the regions of metal contacts to be fabricated, p+ doped zones 21 were created beforehand as local BSF, for example with B diffusion. Apart from this, steps (a) to (c) are similar.

Then, after the metallization step (c), one carries out an annealing step for the formation of the metal contacts on the back side region 19, for example at 400° C. In this case also, an increase in the performances of the cell was also observed.

The invention claimed is:

1. A method of manufacturing a solar cell having a front face and a back, opposing face, the solar cell including a silicon substrate having a first surface proximate to the front face and a second, opposing surface distal from the front face, and the method comprising:

providing a dielectric stack having first and second opposing surfaces, wherein the first surface of the dielectric stack is deposited in direct contact with the second surface of the silicon substrate, and the dielectric stack comprises at least a first dielectric layer comprising Aluminum Oxide (AlOx) and a second dielectric layer, each of the first dielectric layer and the second dielectric layer comprising an associated top surface and a bottom, opposing surface, wherein the top surface of the first dielectric layer is the first surface of the dielectric stack and the top surface of the second dielectric layer is deposited in direct contact with the bottom surface of the first dielectric layer;

removing portions of the second dielectric layer to form at least one partial opening in the dielectric stack in a manner such that at least a continuous portion of the first dielectric layer remains at locations of the dielectric stack in which the at least one partial openings are formed such that the first dielectric layer covers the entire second surface of said substrate;

wherein the at least one partial opening in the dielectric stack is formed through a partial laser ablation process in which portions of the second dielectric layer are substantially completely ablated while the first dielectric layer is only partially ablated;

wherein the thickness of the first dielectric layer after partial ablation at the at least one partial opening is between 1 nanometer (nm) and 30 nm; and providing one or more metal contacts on the back face of the solar cell on the partially ablated first dielectric layer.

2. The method of claim 1 wherein forming the at least one partial opening through the partial laser ablation process comprises applying a pulse laser with a pulse duration of less than about three nanoseconds (ns) to at least a portion of the second dielectric layer.

3. The method of claim 1 wherein providing the dielectric stack comprises providing the first dielectric layer, wherein the first dielectric layer further is provided having a negative charge characteristic, which allows for field effect passivation of the first dielectric layer.

4. The method of claim 1 wherein the second dielectric layer comprises Silicon Nitride ($SiN_x$).

5. A method of manufacturing a solar cell having a front face and a back face, the solar cell comprising a p-type silicon substrate having a first surface proximate the solar cell front face and a second opposing surface, the method comprising:
  providing a dielectric stack having first and second opposing surfaces and disposing the first surface of the dielectric stack over the second surface of the p-type silicon substrate, wherein the dielectric stack comprises at least a first dielectric layer comprising aluminum oxide (AlOx) and a second dielectric layer, each of the first dielectric layer and the second dielectric layers having an associated top surface and a bottom surface, wherein the top surface of the first dielectric layer is the first surface of the dielectric stack and is in direct contact with the second surface of the p-type silicon substrate and
  the second dielectric layer is deposited in direct contact with the bottom surface of the first dielectric layer;
  forming at least one partial opening in the dielectric stack, wherein the at least one partial openings are formed in the second dielectric layer through laser ablation of portions of the second dielectric layer wherein the laser ablation comprises radiating a laser on the at least a portion of the second dielectric layer, wherein the laser radiates in an ultra-violet (UV) region, wherein the UV region comprises a wavelength in the range of about 355 nanometers (nm) and wherein at least a portion of the first dielectric layer remains continuously across the entirety of each of the at least one partial openings;
  wherein the at least one partial opening in the dielectric stack is formed through a partial laser ablation process in which portions of the second dielectric layer are substantially completely ablated while the first dielectric layer is only partially ablated;
  wherein the thickness of the first dielectric layer after partial ablation at the at least one partial opening is between 1 nanometer (nm) and 30 nm; and
  providing one or more metal contacts on the back face of the solar cell on the partially ablated first dielectric layer.

6. The method of claim 1, further comprising: forming the at least one partial opening through the partial laser ablation process comprises applying a pulse laser with a pulse duration of less than about three nanoseconds (ns) to at least a portion of the second dielectric layer.

7. The method of claim 6 wherein applying the metallization layer comprises applying an Aluminum (Al) based metallization layer to the back face of the solar cell.

8. The method of claim 6 further comprising:
  applying a backsurface field (BSF) formation on areas of the solar cell not including the at least one partial opening, wherein the BSF formation is formed at a temperature greater than 740 degrees Celsius.

9. The method of claim 6 wherein providing one or more metal contacts on the back face of the solar cell comprises forming the metal contacts by annealing the back face of the solar cell at a predetermined temperature, wherein the predetermined temperature may be at least 400 degrees Celsius.

10. A method of manufacturing a solar cell having a front face and a back, opposing face, the solar cell including a silicon substrate having a first surface proximate to the front face and a second, opposing surface distal from the front face, and the method comprising:
  providing a dielectric stack having first and second opposing surfaces, wherein the first surface of the dielectric stack is deposited on the second surface of the silicon substrate, and the dielectric stack comprises at least a first dielectric layer comprising Aluminum Oxide (AlOx) and a second dielectric layer, each of the first dielectric layer and the second dielectric layer comprising an associated top surface and a bottom, opposing surface, wherein the top surface of the first dielectric layer is the first surface of the dielectric stack and the top surface of the second dielectric layer is deposited directly on the bottom surface of the first dielectric layer;
  removing portions of the second dielectric layer to form at least one partial opening in the dielectric stack in a manner such that the first dielectric layer remains at locations of the dielectric stack in which the at least one partial openings are formed such that the first dielectric layer covers the entire second surface of said substrate;
  wherein the at least one partial opening in the dielectric stack is formed through a partial laser ablation process in which portions of the second dielectric layer are substantially completely ablated while the first dielectric layer is only partially ablated;
  wherein the thickness of the first dielectric layer after partial ablation at the at least one partial opening is between 1 nanometer (nm) and 30 nm; and
  providing one or more metal contacts on the back face of the solar cell on the partially ablated first dielectric layer.

11. The method of manufacturing of a solar cell of claim 10 wherein removing portions of the second dielectric layer comprises removing portions of the second dielectric layer to form a plurality of openings in the dielectric stack in a manner such that the first dielectric layer remains and covers the second surface of said substrate within the entirety of each of the plurality of openings.

12. The method of claim 11 wherein forming the plurality of openings in the dielectric stack comprises forming the plurality of openings in the dielectric stack through a partial laser ablation process in which portions of the second dielectric layer are substantially completely ablated while the first dielectric layer is, at most, partially ablated such that within each of the plurality of openings, the first dielectric layer covers the entire substrate.

* * * * *